(12) United States Patent
Kikuchi

(10) Patent No.: US 6,335,289 B1
(45) Date of Patent: Jan. 1, 2002

(54) MANUFACTURING METHOD OF SEMICONDUCTOR DEVICE

(75) Inventor: Takeshi Kikuchi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/525,745

(22) Filed: Mar. 14, 2000

(30) Foreign Application Priority Data

Mar. 17, 1999 (JP) .................................. 11-072009

(51) Int. Cl.$^7$ .................................. H01L 21/311
(52) U.S. Cl. .................................................. 438/702
(58) Field of Search .......................... 438/424, 425, 438/427, 700, 702, 703, 689, 696, 745, 756

(56) References Cited

U.S. PATENT DOCUMENTS

| | | | | |
|---|---|---|---|---|
| 5,124,271 A | * | 6/1992 | Havemann | 437/31 |
| 5,354,418 A | * | 10/1994 | Kumihashi et al. | 156/643 |
| 5,394,012 A | * | 2/1995 | Kimura | 257/739 |
| 5,563,096 A | * | 10/1996 | Nasr | 437/186 |
| 5,909,623 A | * | 6/1999 | Saihara | 438/341 |

FOREIGN PATENT DOCUMENTS

JP 6-295908 10/1994 ........ H01L/21/3205

* cited by examiner

*Primary Examiner*—Robert Kunemund
*Assistant Examiner*—Matthew Anderson
(74) *Attorney, Agent, or Firm*—Foley & Lardner

(57) ABSTRACT

The present invention relates to a method of manufacturing a semiconductor device; which comprises the steps of forming, upon a substrate having a plurality of raised sections on the surface, a polysilicon film so as to fill up recesses formed between these raised sections and, through patterning, forming a polysilicon line therefrom; forming a natural oxidation film or an oxide film with a thickness of 1 nm to 3 nm on the surface of said polysilicon line; forming an additional polysilicon film, and thereafter etching back said additional polysilicon film; forming an insulating film thereon, and thereafter forming sidewalls from said insulating film through etching back; forming a diffusion region on said substrate; and forming a silicide film over said polysilicon line. According to the present invention, a silicide film can be formed evenly over a polysilicon line that is formed on a stepped substrate so that, with this technique, semiconductor devices having excellent characteristics and reliability can be manufactured with a high yield.

6 Claims, 5 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device and more particularly to a method of forming a well conductive polysilicon line on a stepped substrate.

2. Description of the Related Art

As an example of the conventional method of forming a polysilicon line on a stepped substrate, a method of manufacturing a flash memory element is described, with reference to the drawings. FIG. 1 is a plan view showing a flash memory element in the manufacturing stage where a silicide film has just been formed, though not shown in the drawing, over gates as well as diffusion regions thereof. FIG. 2 and FIG. 3 are cross-sectional views of FIG. 1, taken on line A—A and on line B—B, respectively. Further, FIG. 4 is a series of cross-sectional views taken on line A—A, illustrating the steps of the manufacturing method over a recess in the vicinity of a field isolating film. Regarding reference numerals in FIG. 1, 101 represents a memory cell gate, 102, a field isolating film and 103, a unit cell region.

First, upon a silicon substrate 1, field isolating films 2 (102) are formed in stripes and, over the rest of the substrate surface left between these field isolating films, silicon oxide films 3 are formed.

Next, a polysilicon film to be used for floating gates is applied over this substrate and, through patterning, floating gates 4 are formed therefrom.

Subsequently, inter-gate insulating films 5 made of an ONO film (silicon oxide film/silicon nitride film/silicon oxide film) or the like are formed (FIG. 4(a)).

Next, a polysilicon film to be used for control gates is applied to fill up the gaps between the floating gates and, through patterning, control gates 6 which intersect the field isolating films 2 (102) at right angles are formed therefrom in stripes (FIG. 4(b)).

Next, performing ion implantation into the substrate surface with a low dose, LDD (Lightly Doped Drain) diffusion regions 9 to make the device have a higher breakdown voltage are formed.

Next, after a silicon oxide film to be used for sidewall formation is grown by the CVD (Chemical Vapour Deposition) or the like, the film is etched back by anisotropic etching so as to form, on lateral faces of the gates, sidewalls composed of the silicon oxide film. After that, performing ion implantation into the substrate surface, diffusion regions 8 that are to become source-drain regions (SD diffusion regions) are formed.

Next, after ion implantation to amorphize the surfaces of the control gates 6 as well as those of diffusion regions 8 is carried out, a refractory metal such as Ti, Co or the like is deposited by means of sputtering and, with a subsequent heat treatment for silicidation performed, a silicide film 10 is formed on control gates as well as diffusion regions (FIG. 4(c)).

The conventional manufacturing method described above, however, has the following problems. As shown in FIG. 4(b), a depression 11 arises on a section of a control gate 6 lying over a recess between two floating gates 4. Within this depression 11, a part of the silicon oxide film (residual silicon oxide film 12) remains even after the silicon oxide film is subjected to etching back in the step of forming sidewalls. This residual silicon oxide film 12 hinders the ion implantation for amorphization and the reaction for silicidation so that an uneven silicide film is formed. Once such an uneven silicide film is formed, the resistance of polysilicon gates cannot be sufficiently reduced, which leads not only to the deterioration of element characteristics but also to the reduction in production yield and reliability through the dispersion of the resistance values of the gates.

SUMMARY OF THE INVENTION

An object of the present invention is to provide a method of manufacturing a semiconductor device, which is capable to form a well conductive polysilicon line on a stepped substrate and still possible to be used to produce semiconductor devices having excellent element characteristics and reliability with a high yield.

The first aspect of the present invention lies in a method of manufacturing a semiconductor device; which comprises the steps of:

forming, upon a substrate having a plurality of raised sections on the surface, a polysilicon film so as to fill up recesses formed between these raised sections and, through patterning, forming a polysilicon line therefrom;

forming a natural oxidation film or an oxide film with a thickness of 1 nm to 3 nm on the surface of said polysilicon line;

forming an additional polysilicon film by growing polysilicon thereon, and, thereafter, etching back said additional polysilicon film;

forming an insulating film thereon, and, thereafter, forming sidewalls from said insulating film through etching back;

forming a diffusion region on said substrate; and forming a silicide film over said polysilicon line.

The second aspect of the present invention lies in a method of manufacturing a semiconductor device of the first aspect of the present invention; wherein, in the step of etching back said additional polysilicon film, etching is carried out under certain conditions while monitoring the etching rate or the emission intensity and etching is terminated through detecting the point when said oxide film changes the etching rate or the emission intensity.

The third aspect of the present invention lies in a method of manufacturing a semiconductor device of the first or second aspect of the present invention; which is a method of manufacturing a flash memory element wherein said raised sections form floating gates thereof and said polysilicon line which is to function as control gates thereof is laid on said floating gates over an inter-gate insulating film.

According to the present invention, a silicide film can be formed evenly over a polysilicon line that is formed on a stepped substrate so that, with this technique, semiconductor devices having excellent characteristics and reliability can be manufactured with a high yield.

DETAILED DESCRIPTION OF THE PREFERRED EMBODIMENTS

Figure 1:
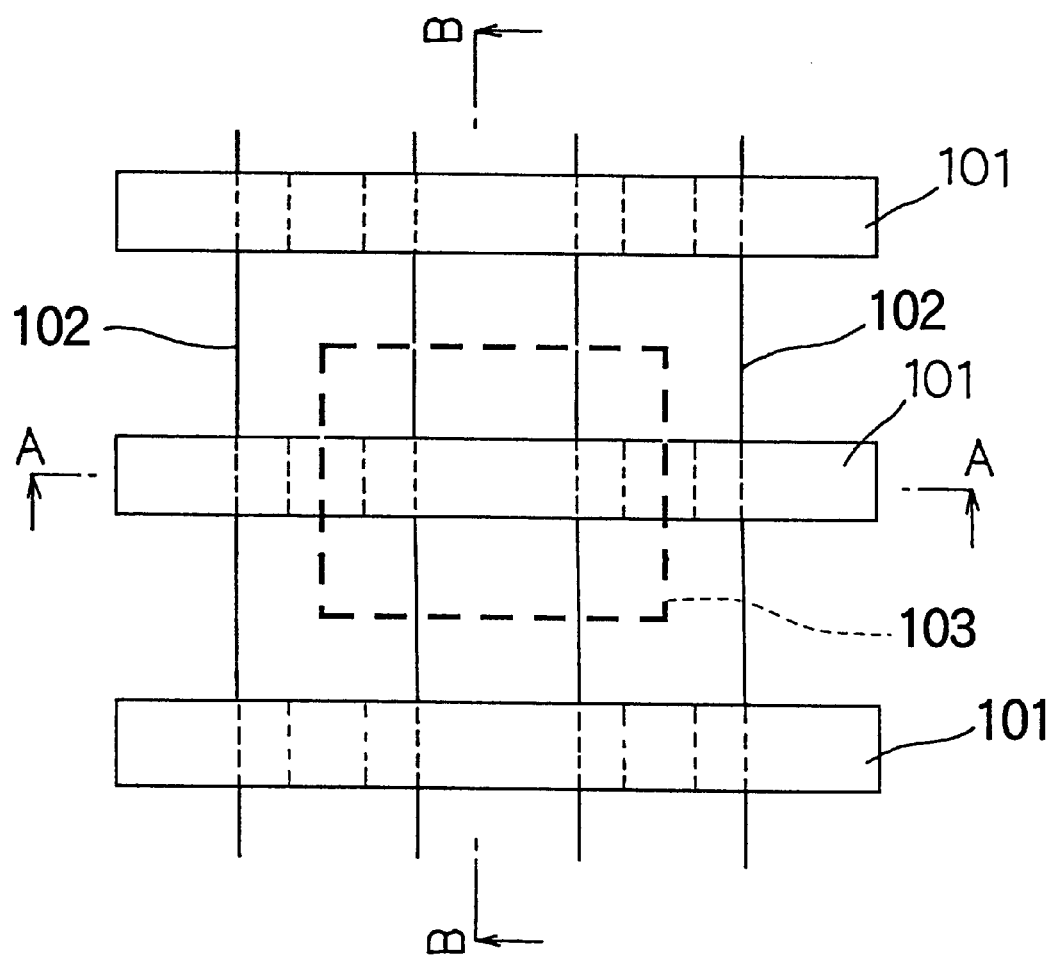
FIG. 1 is a plan view showing a flash memory element in the manufacturing stage where a silicide film has just been formed over gates as well as diffusion regions thereof.
Figure 2:
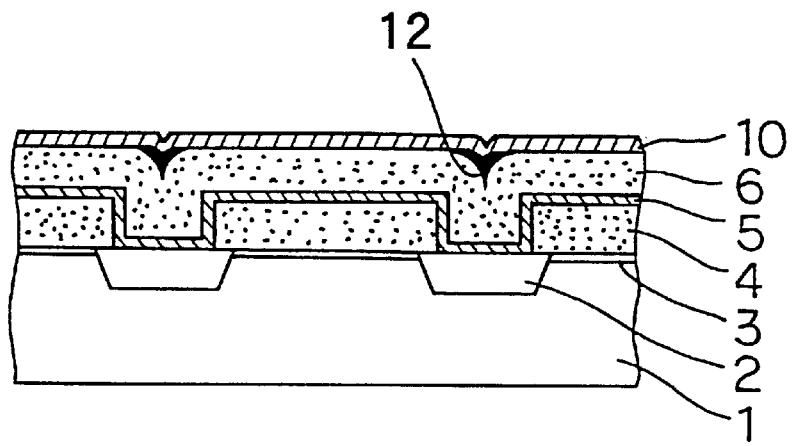
FIG. 2 is a cross-sectional view (taken on line A—A of FIG. 1) showing the element in the manufacturing stage where a silicide film has just been formed over gates as well as diffusion regions thereof.
Figure 3:
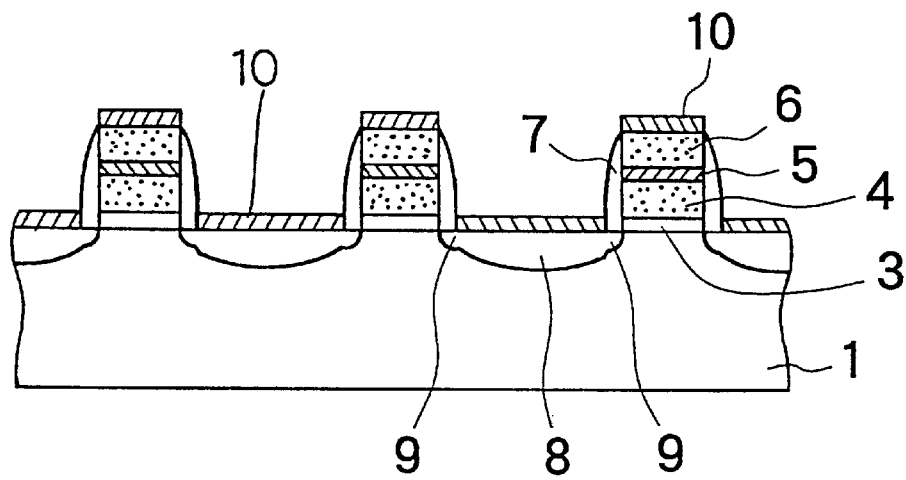
FIG. 3 is a cross-sectional view (taken on line B—B of FIG. 1) showing the element in the manufacturing stage where a silicide film has just been formed over gates as well as diffusion regions thereof.

Referring to the preferred embodiments, the present invention is described in detail below.

First, in the same way as the prior art described above, upon a silicon substrate 1, field isolating films 2 (102) are formed in stripes and, over the rest of the substrate surface left between these field isolating films, silicon oxide films 3 are formed.

Next, in the same way as the prior art described above, a polysilicon film to be used for floating gates is applied over this substrate and, through patterning, floating gates 4 are formed therefrom. The patterning is made in such a way that these floating gate patterns are formed in stripes and intersecting the filed isolating films at right angles and that lines constituting memory cell gates 101 are severed over the filed isolating films, forming recesses thereon.

In the present invention, the thickness of the floating gates that defines the outline of each step (a recess) of the substrate is preferably 50 nm to 300 nm and more preferably 100 nm to 200 nm. Further, an interval over which two neighbouring floating gates are severed (a width of the recess in FIG. 4(a)) is preferably 0.2 $\mu$m to 0.4 $\mu$m and more preferably 0.24 $\mu$m to 0.36 $\mu$m.

Subsequently, inter-gate insulating films 5 made of an ONO film or the like are formed (FIG. 4(a)).

Figure 4:
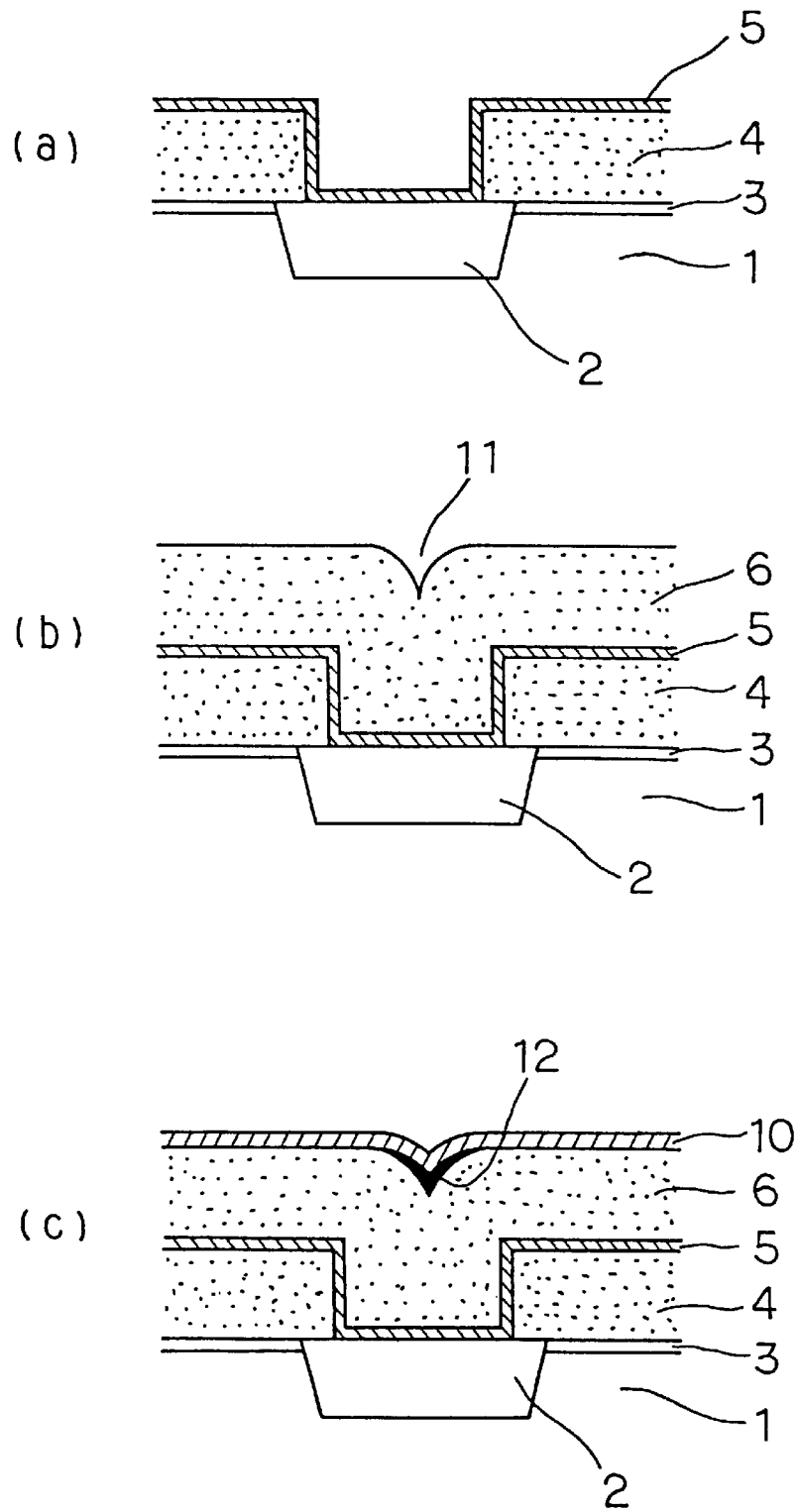
FIGS. 4(a), 4(b), and 4(c) are a series of cross-sectional views Ad illustrating the steps of a conventional method of manufacturing a flash memory element.

Next, in the same way as the prior art described above, a polysilicon film to be used for control gates is applied to fill up the gaps between the floating gates (corresponding to the recess in FIG. 4(a)) and, through patterning, control gates 6 which intersect the field isolating films 2 (102) at right angles are formed therefrom in stripes (FIG. 4(b)).

Figure 5:
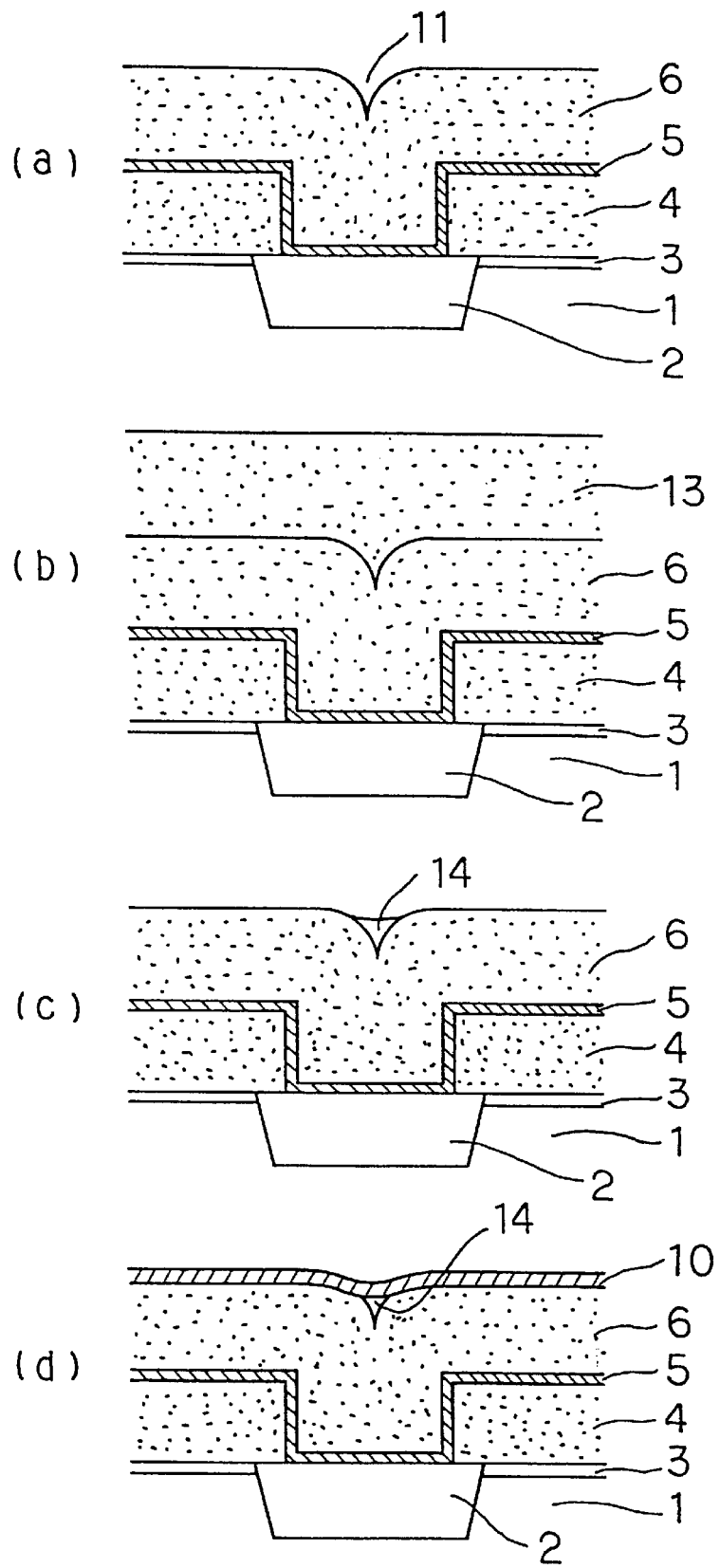
FIGS. 5(a), 5(b), and 5(c) are a series of cross-sectional views illustrating the steps of a method of manufacturing a flash memory element in accordance with the present invention.

As described above, up to the step of forming control gates, the same steps as in the afore-mentioned conventional manufacturing method are followed, obtaining the element structure shown in FIG. 5(a). FIG. 5(a), hereat, is the same drawing as FIG. 4(b) which shows the element structure obtained after formation of control gates in the conventional manufacturing method.

In a method of the present invention, after control gates are formed, a thin oxide film (not shown in the drawings) is formed thereon by bringing oxygen into contact with the surfaces of the control gates. In order to bring oxygen into contact therewith, a method in which a gas containing oxygen is introduced into the device system and, thus, brought into contact with the surfaces of the control gates can be utilized. As for the gas containing oxygen, an oxygen gas, the air, or alternatively an oxygen gas diluted with an inert gas such as nitrogen, helium, argon or the like may be used. The contact temperature is preferably 600° C. to 650° C. The contact time required to form a thin but sufficient oxide film is 30 minutes or longer.

A thin oxide film formed in this manner is preferably 1 nm to 3 nm thick and possibly a so-called natural oxidation film. Various conditions described above are appropriately set so as to allow such a relatively thin oxide film to be formed. When the oxide film is too thick, for example, in case a so-called thermal oxidation film with a thickness exceeding 10 nm is formed, the thick thermal oxidation film is left within the depressions 11 so that, as in the aforementioned conventional method, amorphization by ion implantation or silicidation in the later steps cannot be carried out to the full and, therefore, a silicide film cannot be formed evenly. In contrast with this, an oxide film as thin as a natural oxidation film, which is the one used in the present invention, hardly ever affects the ion implantation for amorphization or silicidation.

Next, as shown in FIG. 5(b), an additional polysilicon film 13 is formed. While the thickness of the additional polysilicon film is appropriately set, depending on the depth of depressions 11, it is preferably 50 nm to 300 nm and more preferably 100 nm to 200 nm.

After that, as shown in FIG. 5(c), the additional polysilicon film 13 is etched back in such a way that the additional polysilicon film is left within the depressions 11 as much as to fill up the depressions. A section indicated by the reference numeral 14 in the drawing is a buried polysilicon film which is left and buried within the depression to fill it up.

By filling up the inside of the depressions 11 in this manner, the surfaces of the control gates are planarized and, consequently, when a silicon oxide film to be used for sidewalls is formed in a later step, it becomes difficult for this silicon oxide film to remain within the depressions after being subjected to etching back.

Further, in etching back the additional polysilicon film, because the etching rate for said thin oxide film is smaller than that for polysilicon, if etching is carried out under certain conditions while monitoring the etching rate or monitoring the emission intensity at an emission wavelength specific to a film or a product in the etching reaction, it is possible to terminate the etching at a prescribed position through detecting the point when this thin oxide film changes the etching rate or the emission intensity.

With respect to the degree of over-etch in etching back the additional polysilicon film, it is preferably 20 nm or so as a thickness of the polysilicon film to be etched, and more preferably 10 nm or so. If the degree of over-etch is excessive, the polysilicon film to be used for control gates may become too thin or even depressions may come up.

Next, performing ion implantation into the substrate surface with a low dose, LDD diffusion regions 9 to make the device have a higher breakdown voltage are formed.

Next, after an insulating film to be used for sidewall formation such as a silicon oxide film or the like is grown by the CVD or the like, the film is etched back by anisotropic etching so as to form, on lateral faces of the gates, sidewalls composed of that insulating film. Regarding the insulating film to be used for sidewalls, the rate of over-etch is preferably 10% or less and more preferably 3% to 7%. When the rate of over-etch is too large, sidewalls around the upper sections of lateral faces of the gates may disappear or the surface of the substrate may suffer some damages, which causes deterioration of the element characteristics and reliability. On the other hand, when no over-etch is made or the rate of over-etch is too small, the insulating film is liable to remain on the gates and prevent amorphization by the ion implantation or silicidation to proceed to the full. The rate of over-etch, herein, is the ratio (%) of the time spent for the additional etching to the time spent for the main-etching.

Next, performing ion implantation into the substrate surface, diffusion regions 8 that are to become source-drain regions (SD diffusion regions) are formed.

Next, after ion implantation to amorphize the surfaces of the control gates 6 as well as those of diffusion regions 8 is carried out, a refractory metal such as titanium (Ti), cobalt (Co), nickel (Ni) or the like is deposited by means of sputtering and, with a subsequent heat treatment for silicidation performed, a silicide film 10 is formed on control gates as well as diffusion regions (FIG. 5(d)). Further, metal films such as metal nitride films or the like being formed over the field isolating films 2 (102) are removed selectively by wet etching.

As dopants used in the ion implantation for amorphization, an element with a relatively large mass such as arsenic (As), antimony (Sb), germanium (Ge), indium (In) or the like can be employed.

Further, in the above method, the ion implantation for amorphization can be alternatively carried out after a refractory metal is deposited by means of sputtering. Further, thermal annealing to lower the resistance of the silicide film can be performed after the silicide film is formed.

Now, for the purpose of examining the effects of the present invention, the following experiment and evaluation were made.

Upon a silicon substrate, a CVD oxide film with a thickness of 150 nm was formed and then patterned so as to form stepped patterns (5400 in number of lines) with the line and space pairs (L/S=0.5 $\mu$m/0.28 $\mu$m). On these patterns, a line (9500 $\mu$m in length, 0.32 $\mu$m in width, 0.2 $\mu$m in thickness and $3 \times 10^{19}$ atoms/cm$^3$ in P concentration) made of polysilicon was formed so as to intersect these lines of patterns at right angles. The cross-sectional observation by the SEM (Scanning Electron Microscopy) revealed that depressions formed on sections of the polysilicon line lying above the intervals of the lines in the underlying stepped patterns had a depth of approximately 72 nm. This polysilicon line corresponds to the control gates in actual flash memory elements. The polysilicon line, hereat, was formed to run back and forth repeatedly over the underlying stepped patterns and both ends thereof were connected with respective conductive pads. The resistance of the polysilicon line was, then, obtained by measuring the resistance between these two conductive pads.

An example was formed according to the embodiment described above. That is, by introducing the air into the device system at 650° C., a thin oxide film with a thickness of 2 nm was formed on the surface of the polysilicon line, and thereafter an additional polysilicon film was formed to a thickness of 100 nm.

Subsequently, this additional polysilicon film was etched back. In that, etching was carried out under certain conditions while monitoring the emission intensity at an emission wavelength specific to the etching reaction of polysilicon, and etching was terminated through detecting the point when the emission intensity dropped. The cross-sectional observation by the SEM showed that the depressions thereof had a depth of approximately 40 nm, which was 32 nm shallower than before, and besides the features thereof became smoother.

Next, performing ion implantation into the substrate surface with a low dose, a LDD was formed, and, then, after a silicon oxide film was grown to a thickness of 100 nm by the CVD, etching back was performed so as to make the rate of over-etch 5% and thereby sidewalls were formed.

Next, after ion implantation was performed into the substrate surface and diffusion regions corresponding to the source-drain regions were formed, another ion implantation for amorphization was carried out using arsenic (As) (40 keV and with a dose of $1 \times 10^{15}$/cm$^2$ ).

Following this, titanium (Ti) was deposited to a thickness of 30 nm by sputtering. A heat treatment was then conducted in a nitrogen atmosphere at 690° C. for 30 seconds and titanium silicide (TiSi$_2$) was formed, and thereafter unreacted Ti was removed by wet etching. Further, another heat treatment was performed at 840° C. for 10 seconds and, through a phase transition, this turns titanium silicide first formed into a titanium silicide film with a still lower resistance.

As a case for comparison, a sample was formed in the same way as the above sample except that, without forming an additional polysilicon film, a silicide film was formed directly over the polysilicon line after forming sidewalls.

Figure 6:
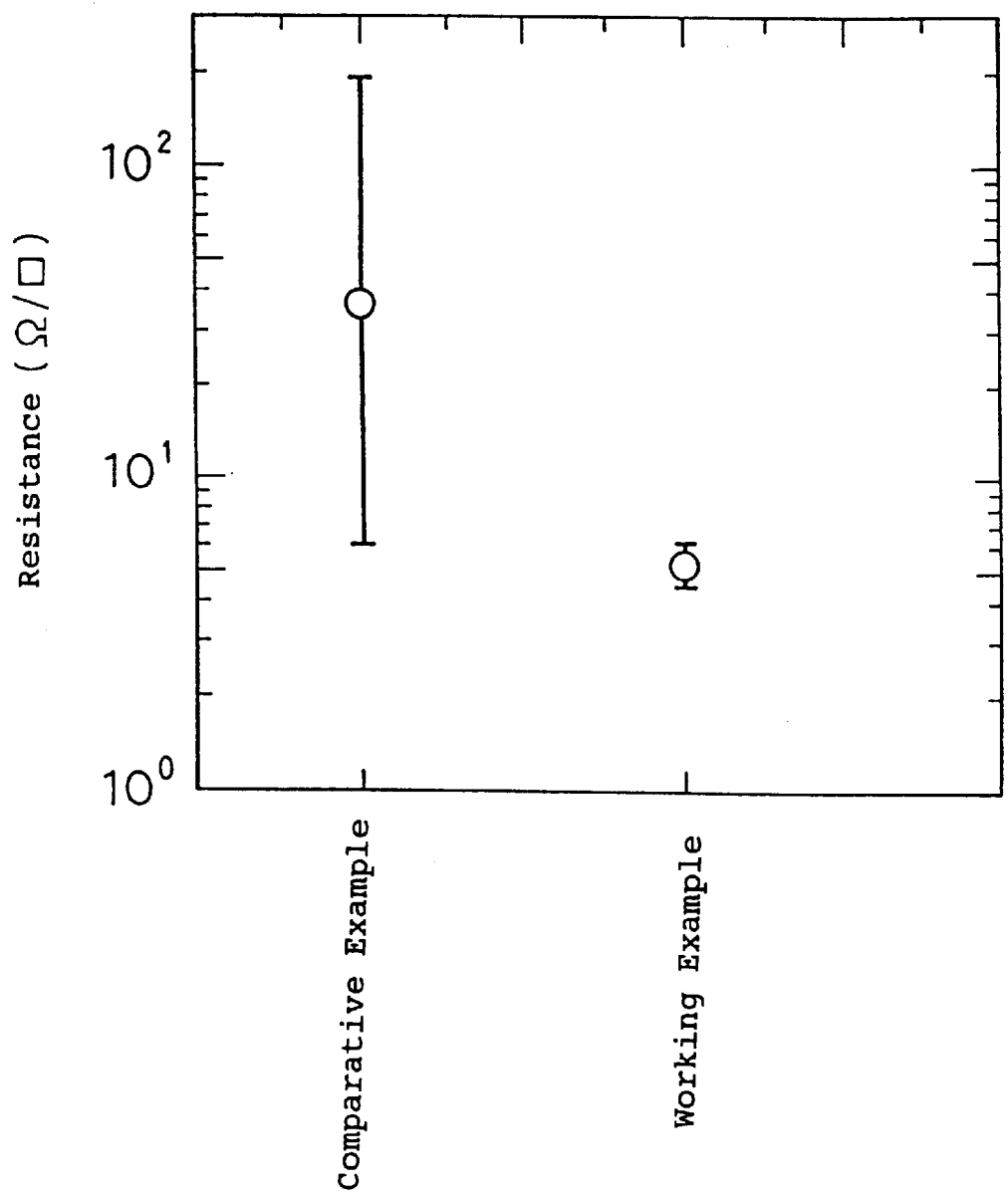
FIG. 6 is a diagram showing the results of the measurements of the resistance for two sets of polysilicon lines formed on respective stepped substrates, one set by the method of the present invention and the other set, by that of the prior art. Each measurement was made after forming a silicide film thereon.

FIG. 6 shows the results of the measurements of the resistance for two sets of polysilicon lines (50 samples each), each measurement made after a silicide film was formed. The diagram clearly indicates that, while the A resistances of the samples manufactured by the conventional method are high and very much dispersed in value, the resistances of the samples manufactured by the method of the present invention are low and little dispersed.

What is claimed is:

1. A method of manufacturing a semiconductor device; which comprises the steps of:

forming, upon a substrate surface having a plurality of raised sections a polysilicon film so as to fill up recesses formed between these raised sections and, through patterning, forming a polysilicon line therefrom, the polysilicon line having depressions above said recesses;

forming a natural oxidation film or an oxide film with a thickness of 1 nm to 3 nm on the surface of said polysilicon line;

forming an additional polysilicon film and, thereafter, etching back said additional polysilicon film;

forming an insulating film thereon, and, thereafter, forming sidewalls from said insulating film through etching back;

forming a diffusion region on said substrate; and forming a silicide film over said polysilicon line.

2. The method of manufacturing a semiconductor device according to claim 1; wherein, in the step of etching back said additional polysilicon film, etching back is performed in such a way that the additional polysilicon film is left within the depressions formed on sections of the polysilicon line lying above said recesses.

3. The method of manufacturing a semiconductor device according to claim 2; wherein, in the step of etching back said additional polysilicon film, etching is carried out while monitoring an etching rate or an emission intensity and etching is terminated through detecting a point when said oxide film changes the etching rate or the emission intensity.

4. The method of manufacturing a semiconductor device according to claim 1; wherein, in the step of forming said sidewalls, a rate of over-etch is not greater than 10%.

5. The method of manufacturing a semiconductor device according to claim 1; which is a method of manufacturing a flash memory element wherein said raised sections form floating gates thereof and said polysilicon line which is to function as control gates thereof is laid on said floating gates over an inter-gate insulating film.

6. The method of manufacturing a semiconductor device according to claim 1; wherein the step of forming the additional polysilicon film comprises a step of growing the polysilicon film.

* * * * *